United States Patent [19]

Campbell et al.

[11] Patent Number: 5,669,775
[45] Date of Patent: Sep. 23, 1997

[54] ASSEMBLY FOR MOUNTING COMPONENTS TO FLEXIBLE CABLES

[75] Inventors: Jeffrey Scott Campbell, Binghamton; James D. Herard, Vestal; Ronald Peter Nowak, Vestal; John Robert Slack, Vestal; David Brian Stone, Owego, all of N.Y.

[73] Assignee: International Business Machines Corporation, Armonk, N.Y.

[21] Appl. No.: 524,361

[22] Filed: Sep. 5, 1995

[51] Int. Cl.$^6$ ................................................ H01R 9/09
[52] U.S. Cl. ................................................ 439/77; 361/761
[58] Field of Search .................... 439/66, 67, 77, 439/493; 361/761

[56] References Cited

U.S. PATENT DOCUMENTS

| | | | |
|---|---|---|---|
| 2,854,502 | 9/1958 | Richter | 174/88 |
| 2,961,629 | 11/1960 | Kamm | 339/17 |
| 3,114,587 | 12/1963 | Herrmann | 339/75 |
| 3,777,221 | 12/1973 | Tatusko et al. | 361/761 |
| 3,896,259 | 7/1975 | Fry | 174/72 |
| 4,018,491 | 4/1977 | Niedzwiecke et al. | 339/4 |
| 4,092,057 | 5/1978 | Walton | 339/17 |
| 4,413,308 | 11/1983 | Brown | 361/398 |
| 4,716,500 | 12/1987 | Payne | 361/398 |
| 4,768,287 | 9/1988 | Thies | 29/861 |
| 4,812,135 | 3/1989 | Smith | 439/493 |
| 4,917,613 | 4/1990 | Kabadi | 439/67 |
| 5,201,021 | 4/1993 | Delage et al. | 385/114 |
| 5,213,512 | 5/1993 | Campbell et al. | 439/67 |
| 5,239,448 | 8/1993 | Perkins et al. | 361/764 |
| 5,373,230 | 12/1994 | Balyasny et al. | 324/158.1 |
| 5,383,787 | 1/1995 | Switky et al. | 439/67 |
| 5,389,741 | 2/1995 | Ueno | 174/117 |

*Primary Examiner*—Neil Abrams
*Assistant Examiner*—Eugene G. Byrd
*Attorney, Agent, or Firm*—Baker, Maxham, Jester & Meador

[57] ABSTRACT

A support structure is attached to the front or back side of a flexible circuit by direct mounting to the flexible circuit flat ribbon cable, thereby providing a stress-free region of the cable in which the flexible circuit electrical components can be mounted. The support structure comprises a flat ring that is attached to the cable by adhesive, soldering, or mechanical fastening. The flat ring mounts on one side of the flat ribbon cable and encloses an area of the cable that is sufficiently large for the mounting of the flexible circuit electrical components. The flat ribbon cable within the enclosed area is held flat and free from stress, even as the cable is handled. Thus, any components mounted within the enclosed area are not subjected to bending moments. The invention also can be incorporated into cable connectors, such as multi-pin connectors at the ends of cables, and can include support hooks and air cooling baffles.

29 Claims, 9 Drawing Sheets

ASSEMBLY FOR MOUNTING COMPONENTS TO FLEXIBLE CABLES

BACKGROUND OF THE INVENTION

1. Field of the Invention

This invention relates generally to flexible circuits and, more particularly, to assemblies for mounting electrical components onto flexible electrical cables.

2. Description of the Related Art

Multi-conductor flexible cables are constructed from multiple lengths of electrical wire that are arranged in parallel and are provided with insulation between them. Generally, such cables are used to carry signals between electrical devices connected by the cable. Such cabling may be in the form of a flexible circuit cable in which conductors are typically plated on insulation layers. Such cables are described, for example, in U.S. Pat. No. 5,435,732; U.S. Pat. No. 5,261,155; and U.S. Pat. No. 5,170,931; all assigned to International Business Machines Corporation (IBM Corporation). These cables are generally referred to as flex cables. Multi-conductor flexible cables also may be in the form of separate but adjacent, discrete wires, typically circular wires surrounded by an insulating layer. These cables are generally referred to as flat ribbon cable.

Multi-conductor flexible cables typically are connected to electrical devices with pin and socket connectors. Each conductor or wire in the flexible cable is electrically connected to a pin of a pin connector at a cable end. The pin connector is received into a socket connector at the device or at a cable end. For example, it is common for microcomputer components to be connected by flat ribbon cables having electrically insulated wires arranged side-by-side, running parallel down the length of the cable. The wire diameters are such that the flat ribbon cables are relatively flexible and therefore can be manipulated around tight corners and small spaces typically encountered in the home and office environment where microcomputers are used. Conventional flat ribbon cables typically have wires spaced apart on 0.100 inch or 0.050 inch centers.

It sometimes is advantageous to mount active or passive electrical components directly to a flexible cable. Filter capacitors are an example of a commonly used electrical component. In such an application, filter capacitors are connected to one or more of the conductors in the cable to reduce electrical noise in the signals carried by the cable. Another example of components mounted to connecting cables are termination resistors. It is typical for an electrical component to be directly connected at an intermediate portion of the cable by using surface mount technology (SMT), whereby a wire lead of the component is electrically connected with one of the wires of the cable so that the component rests on the top or bottom surface of the cable. Such component connections comprise what are generally referred to as flexible circuits.

Unfortunately, the electrical components of flexible circuits can become damaged during handling of the cables. Movement of the cable such as during connection and disconnection of devices causes the electrical component leads to undergo stress moments. That is, as cables are routed around corners and through spaces, the wire leads of the electrical components can become repeatedly bent where the leads connect to the cable, thereby weakening the wire lead. Eventually, the component wire lead can break, resulting in circuit failure. The electrical component can break completely off the cable. The electrical component structures also are susceptible to damage during handling of the cable. Resistors and capacitors, for example, can become chipped, altering their specified electrical values. Again, circuit failure is the result.

From the discussion above, it should be apparent that there is a need for a cable assembly that permits electrical components to be mounted on multi-conductor flexible cables with reduced risk of damage to the connections and components, thereby maintaining the effectiveness of the flexible circuits. The present invention satisfies this need.

SUMMARY OF THE INVENTION

In accordance with the invention, a reinforcer is mounted to the front or back side of a multi-conductor flexible cable, thereby providing a stress-free region of the cable in which circuit electrical components can be mounted. Because the component electrical wire leads will not be subjected to stress moments as the cable is handled, the wire leads will not become weakened and the electrical components will be protected from failure. The reinforcer comprises a substantially flat rib or loop that is attached to the cable by any one of a variety of means, including adhesive, soldering, or mechanical fastening. The flat rib or loop defines a cable area of increased local rigidity. The reinforcer can be constructed from any material that will provide a relatively rigid assembly, including flat or ribbed plastic and metal.

In one aspect of the invention, the reinforcer mounts on one side of the multi-conductor flexible cable and encompasses an area of the cable that is sufficiently large for the mounting of the flexible circuit electrical components. The reinforcer can be shaped, for example, as an open loop, semicircle, or square having a width approximately equal to that of the multi-conductor flexible cable and the reinforcer can be glued or mechanically secured to the cable. The flexible cable within the enclosed area is held flat and free from stress, even as the cable is handled. Thus, any components mounted within the enclosed area are not subjected to bending moments from the cable. For further circuit protection, the components can be located within the area of increased rigidity on the same side of the cable as the reinforcer and can then be encased in a sealant material, such as epoxy. The sealant protects the components against abrasion and environmental fluctuations.

The invention also can be incorporated into cable assemblies wherein the reinforcer is incorporated into a connector, such as a multi-pin connector located at the end of a cable. In this way, electrical connections with flexible circuit electrical components can be made at the same time the cable connector is attached to the cable end. Support hooks for locating and fastening the cable with a machine can be incorporated as well, simplifying cable handling while at the same time protecting the electrical components from such handling. Air cooling baffles and heat sinks also can be included, protecting the components from physical damage and also improving cooling air delivery to the components.

Other features and advantages of the present invention should be apparent from the following description of the preferred embodiments, which illustrate, by way of example, the principles of the invention.

DESCRIPTION OF THE PREFERRED EMBODIMENTS

Figure 1:
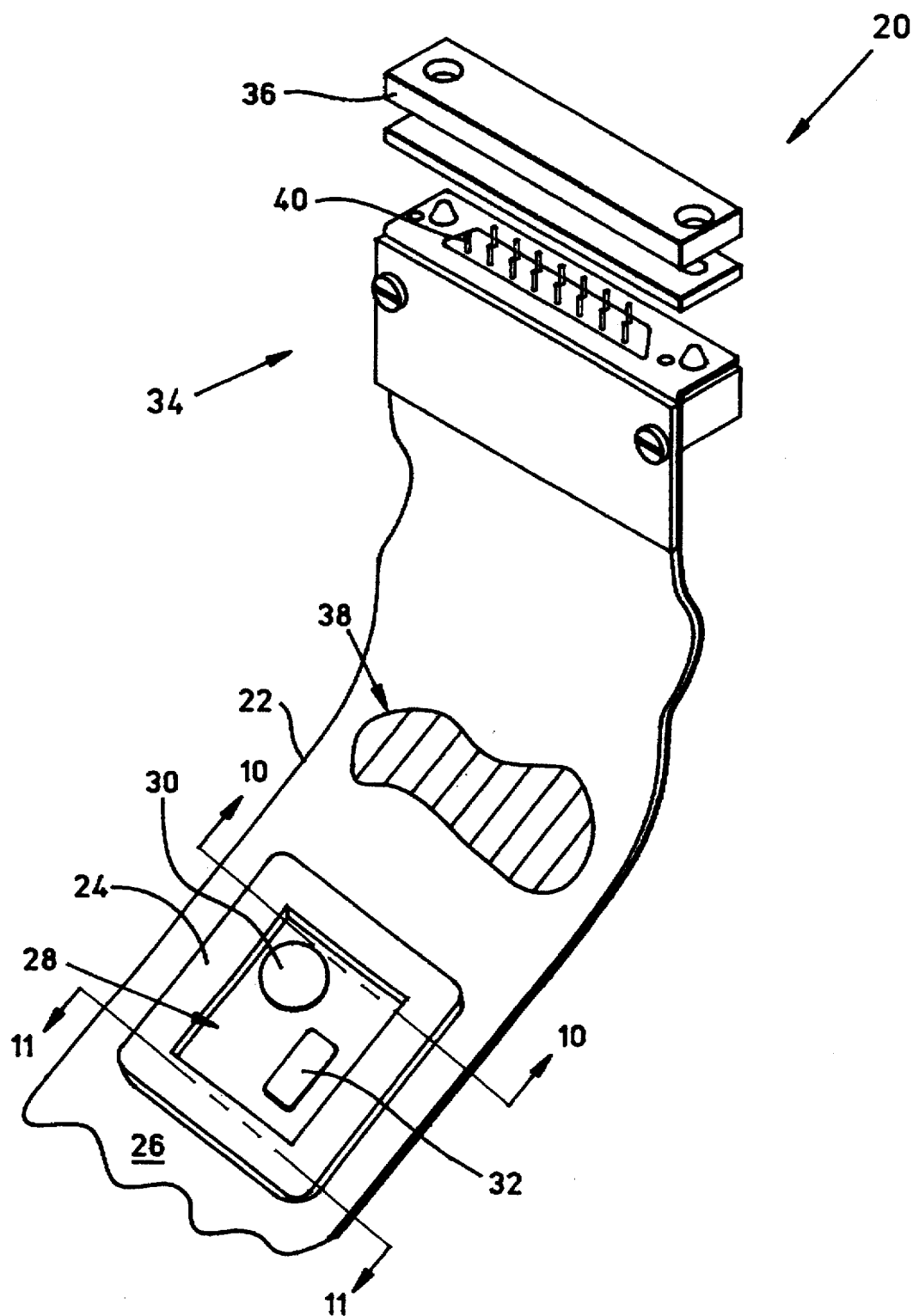
FIG. 1 is a perspective view of an assembly showing a reinforcer, constructed in accordance with the invention, mounted on a flexible cable.

FIG. 1 shows a cable assembly 20 comprising a multi-conductor flexible cable 22 having a reinforcer 24, constructed in accordance with the present invention, mounted on the top surface 26 of the cable. In the FIG. 1 embodiment, the reinforcer comprises a flat loop or ring, defining a closed structure with an open center, that encloses an area 28 of the cable. The enclosed area is sufficiently large such that one or more electrical components 30, 32 can be attached to the cable within the enclosed area using surface mount technology. The enclosed area is stress-free in the sense that the cable 22 can be bent, handled, and otherwise moved about without causing bending moments and other stresses to occur at the connector wire leads of the electrical components. That is, the area 28 encompassed by the reinforcer is a local region of increased rigidity. The enclosed area of the cable will remain substantially flat and immovable even as the cable outside of the reinforcer 24 is moved about. In this way, the reinforcer reduces risk of damage to the components and thereby improves the effectiveness of the flexible circuit.

One end of the cable 22 terminates in a multi-contact connector 34 that can be mated to a matching connector 36 of another cable or of an electronic device. In FIG. 1 a portion of the cable outer insulation is removed to show the plurality of conductors 38 contained within the multi-conductor flexible cable 22. The conductors comprise wires that are arranged in parallel, side-by-side. The wires are covered by an insulation layer, which defines the cable width. It should be understood that each of the conductors is typically connected to a different contact 40 of the connector 34 and that the electrical components 30, 32 are connected to one or more of the wires. In this way, the electrical components can provide useful active and passive flexible circuits. The components can comprise, for example, filter capacitors or termination resistors. The reinforcer 24 can be constructed from a variety of materials, including plastic, stiff laminated papers, metals, and the like. Stiffening walls can be incorporated, if desired.

Figure 2:
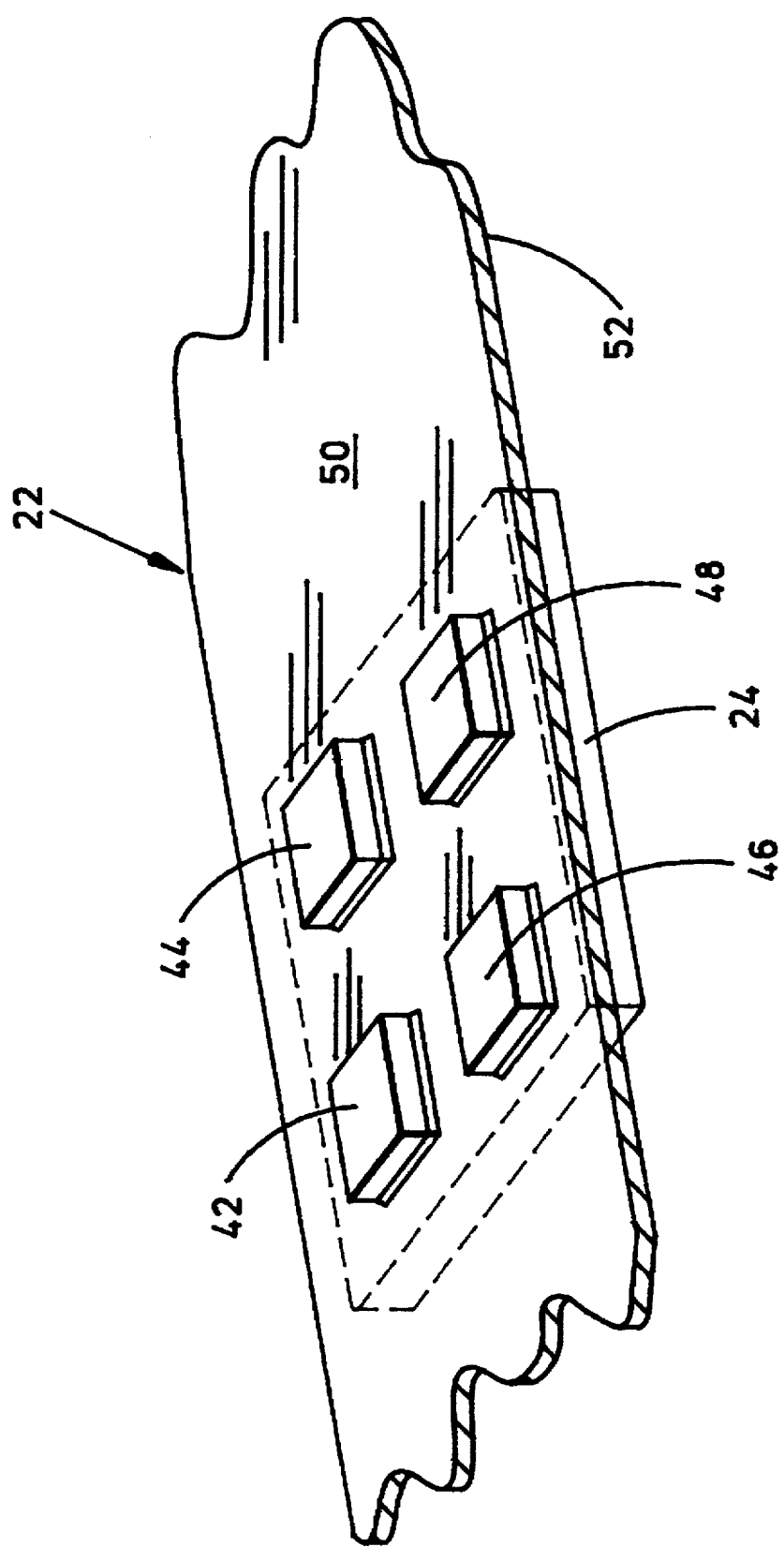
FIG. 2 is perspective view of an assembly showing electrical components mounted on a side of the flexible cable opposite that of the reinforcer.

In the embodiment illustrated in FIG. 1, the electrical components 30, 32 of the flexible circuit are mounted on the same side of the multi-conductor flexible cable 22 as the reinforcer 24. Alternatively, the components can be mounted on the opposite side of the cable from the reinforcer. Such an embodiment is illustrated in FIG. 2, which shows four electrical components 42, 44, 46, 48 mounted on a top surface 50 of the cable 22 and the reinforcer 24 mounted on the bottom surface 52 of the cable. Again, the reinforcer is mounted to the cable and thereby defines an area of the cable that is stress-free and of increased rigidity, and within which the electrical components are mounted. In this way, the components are protected from bending moments as the cable is handled.

Figure 3:
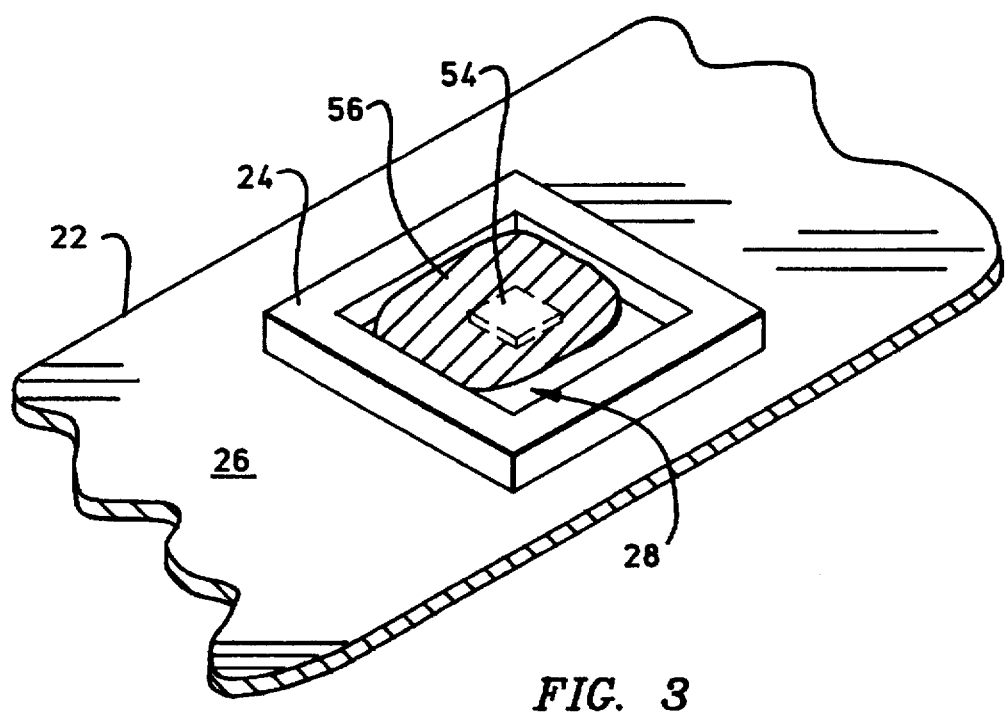
FIG. 3 is a perspective view of the assembly illustrated in FIG. 1 showing the enclosed area within the reinforcer filled with a sealant.

FIG. 3 illustrates that, for added protection of the flexible circuit components, the electrical components 54 can be mounted on the same side of the cable 22 as the reinforcer 24 and the enclosed area 28 can be substantially filled with a sealant material 56, such as a workable epoxy or resin material. The sealant material encases the electrical components to provide a protective covering that helps prevent chipping of the component bodies and helps prevent excessive temperature swings and other harmful environmental effects that might impair performance of the flexible circuit. In the FIG. 3 embodiment, the height of the reinforcer 24 above the cable surface 26 is advantageously selected to be approximately equal to the height of the electrical components. This ensures greater protection of the components from physical damage.

The reinforcer may take shapes other than those illustrated in FIGS. 1–3, so long as the reinforcer defines an area of the flexible cable that will be shielded from bending moments that would otherwise travel along the cable to the wire leads of electrical components mounted therein. For example, it is not necessary for the reinforcer to define a closed structure in the form of a loop or flat ring such as shown in FIGS. 1–3. Two alternative embodiments of open reinforcers are illustrated in FIGS. 4 and 5.

Figure 4:
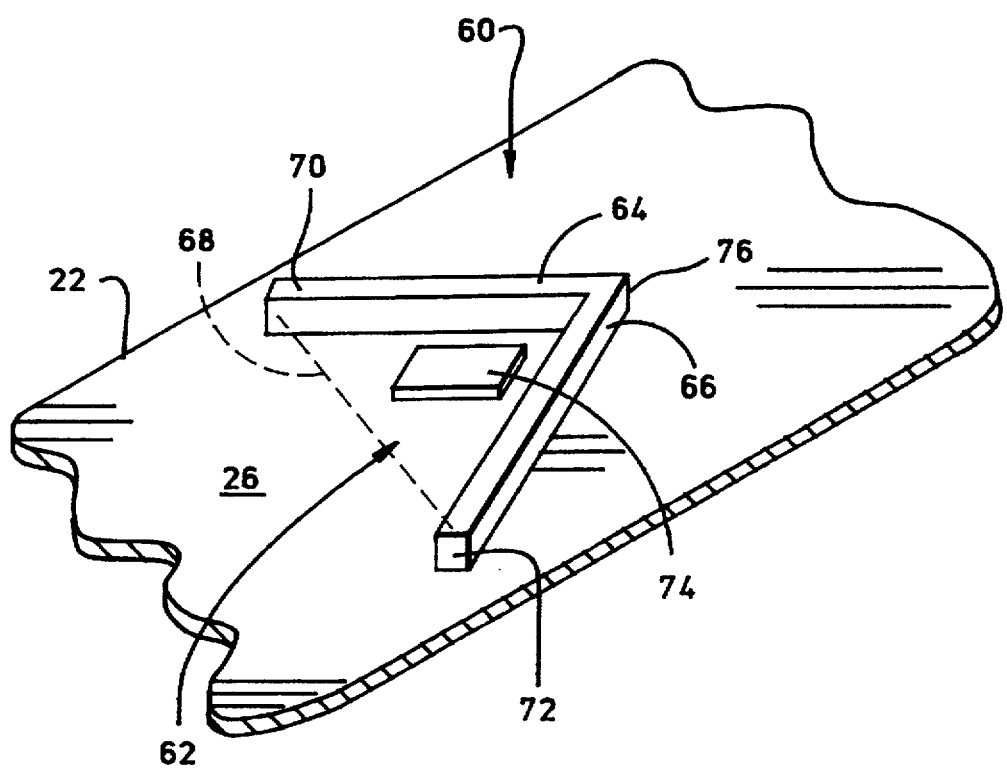
FIG. 4 is a perspective view of a v-shaped reinforcer.

FIG. 4 shows a v-shaped reinforcer 60 mounted on the top surface 26 of the flexible cable 22. An open enclosure area 62 is encompassed within a cable region defined by the two ribs or segments 64, 66 of the reinforcer "v" and an imaginary line segment 68, shown as a dashed line connecting the respective open ends 70, 72 of the reinforcer. The open enclosure area is sufficiently large to encompass one or more electrical components 74 whose electrical lead wires will be free from bending moments at the cable 22, even as the cable is handled. That is, bending forces due to handling of the cable 22 will not travel along the cable and pass within the enclosure area 62. In this way, the reinforcer 60 provides a cable region of increased local rigidity where the electrical components are located.

The maximum distance between the open ends 70, 72 of the reinforcer 60 may be generally referred to as the width of the reinforcer. Similarly, the distance from the imaginary line segment 68 to the joint 76 of the reinforcer ribs may be referred to as the length of the reinforcer. In view of these definitions, it should be apparent that the reinforcer 60 has a length that is less than the corresponding length of the cable 22 and has a width that is less than the corresponding width of the cable (measured across the cable).

Figure 5:
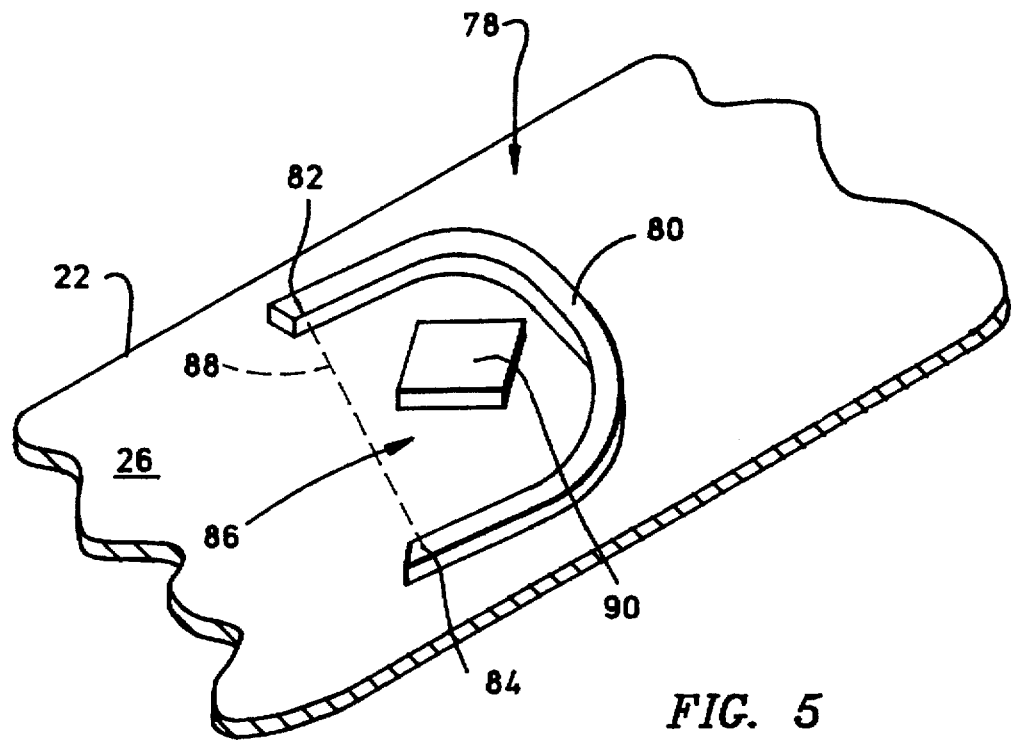
FIG. 5 is a perspective view of a semi-circular reinforcer.

FIG. 5 shows a semi-circular reinforcer 78 mounted on the top surface 26 of the flexible cable 22. The reinforcer comprises an open circle or horseshoe-shaped ring 80 having two free ends 82, 84. The open circle 80 defines an open enclosure area 86 encompassed within the open circle and an imaginary line segment 88 shown as a dashed line connecting the free ends 82, 84. The enclosure area is sufficiently large to encompass one or more electrical components 90 whose electrical lead wires will be free from bending moments. That is, bending forces due to handling of the cable 22 will not be permitted to travel within the enclosure area 86. As with the other embodiments described above, the reinforcer 78 provides a cable area of increased local rigidity where the electrical components are located.

As was the case above for the v-shaped reinforcer, if the maximum distance across the open circle 80 of the reinforcer 78 in the cross direction of the cable 22 is considered to be the reinforcer width, and if the maximum distance across the open circle along the length of the cable is considered to be the reinforcer length, then it should be apparent that the length of the reinforcer is less than the corresponding length of the cable and the width of the reinforcer is less than the corresponding width of the cable.

Figure 6:
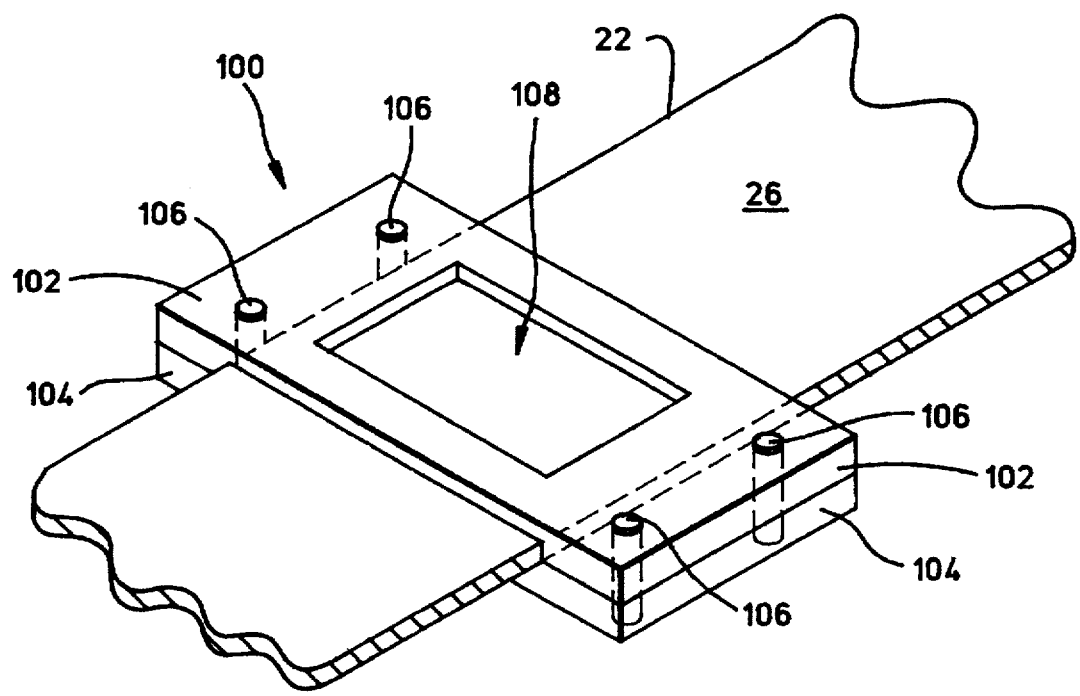
FIG. 6 is a perspective view of an assembly showing a two-piece reinforcer.

A variety of attachment schemes can be used to mount the reinforcer to the flexible cable 22. For example, adhesive materials such as glue, epoxy, or contact cement can be used to bond the reinforcer to the cable. Those skilled in the art will readily appreciate the range of adhesives that can be suitably used, without further explanation. FIG. 6 illustrates an alternative attachment scheme in which a reinforcement assembly 100 is mounted to the cable 22 with a mechanical fastener. In FIG. 6, the reinforcer assembly comprises a top plate 102 and a bottom stiffener 104 that are held together with four screws 106. The screws clamp the top plate 102 and the bottom stiffener 104 around the multi-wire cable 22.

Because the top plate 102 is mounted to the cable 22 by the clamping force from the bottom stiffener 104, the top plate encloses an area 108 of the cable 22 that is stress-free and within which can be mounted flexible circuit components, such as illustrated above. As with the embodiments described above, the reinforcer assembly 100 reduces the risk of damage to the components and improves the effectiveness of the flexible circuit.

Figure 7:
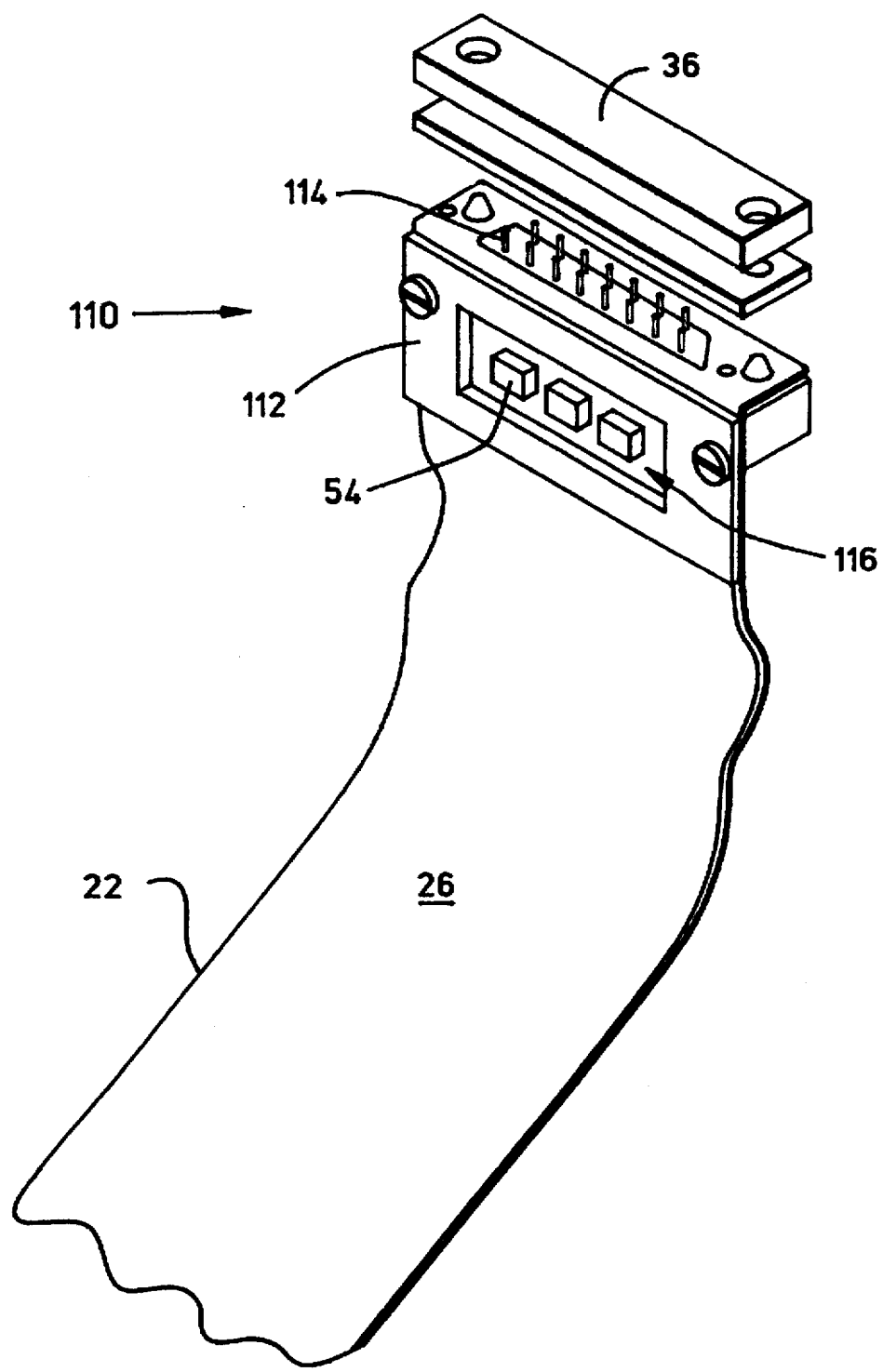
FIG. 7 is a perspective view of an electrical connector constructed in accordance with the present invention.

In another aspect of the invention, illustrated in FIG. 7, the reinforcer is incorporated with a cable connector. FIG. 7 shows that a multi-contact socket connector 110 can incorporate a flange 112, similar to the top plate described above, that is attached to a length of the cable 22 leading to the connecting pins 114 and that defines an enclosed area 116 that is stress-free. FIG. 7 shows the electrical components 54 mounted to the cable in the enclosed area. In this way, a cable connector and flexible circuit reinforcer assembly can be provided in a single structure, thereby reducing the cost, complexity, and bulkiness of connecting cables.

Figure 8:
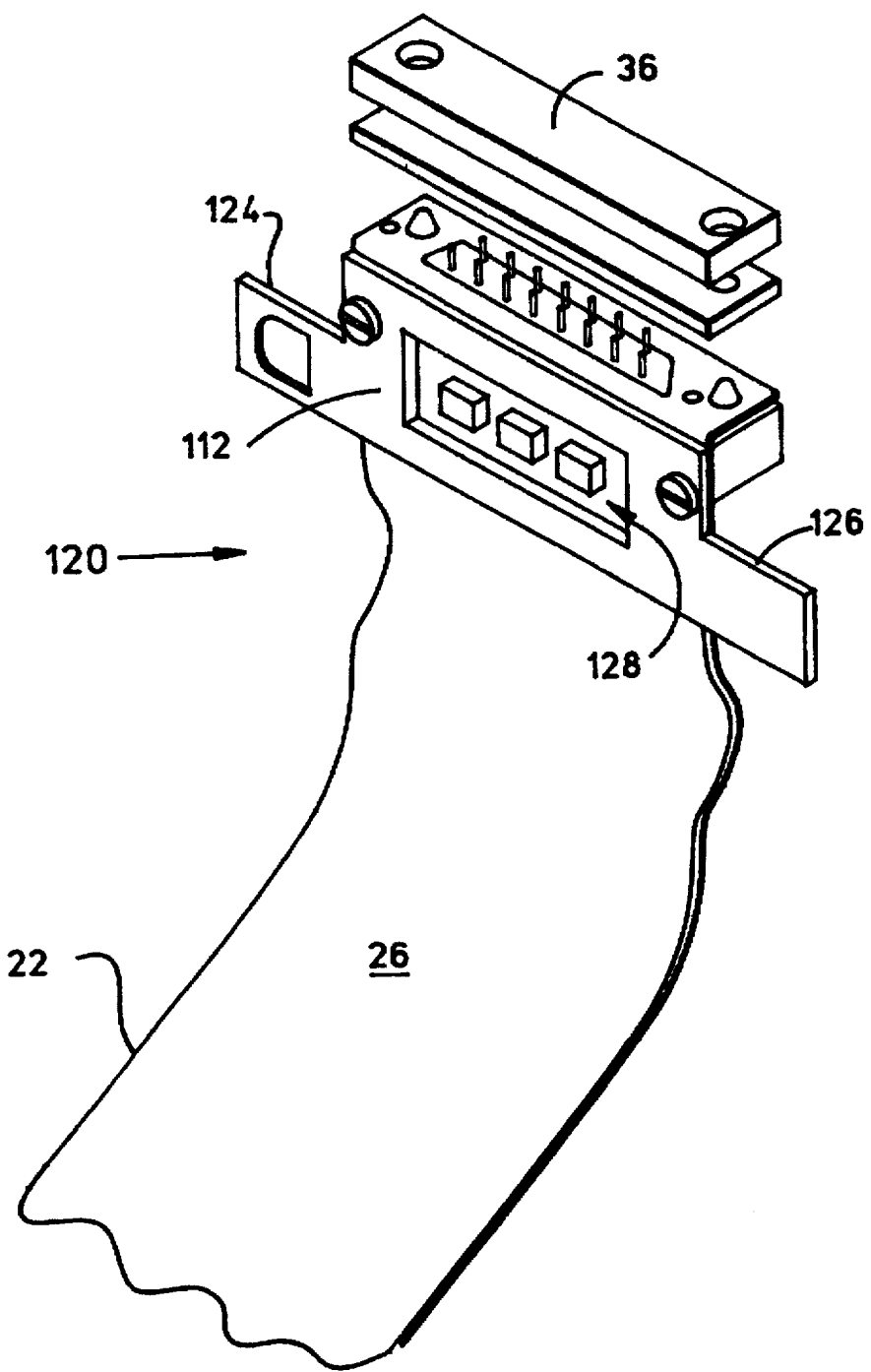
FIG. 8 shows the electrical connector of FIG. 7 with a support hook for mechanical retention and strain relief.

Additional refinements can be provided. For example, FIG. 8 shows an alternative embodiment of a reinforcer assembly cable connector 120 in which the connector flange 122 includes a support hook 124. The support hook can be used, for example, to hang the cable 22 from a mounting point or to fasten the connector in a desired location. The connector also can include a handling tab 126 that provides a gripping surface for easier grasping of the cable connector. In FIG. 8, the handling tab is conveniently used together with the support hook 84 for grasping the connector. It should be understood that the cable connector can be provided with two handling tabs or two support hooks, which also provide for easier grasping of the connector.

Figure 9:
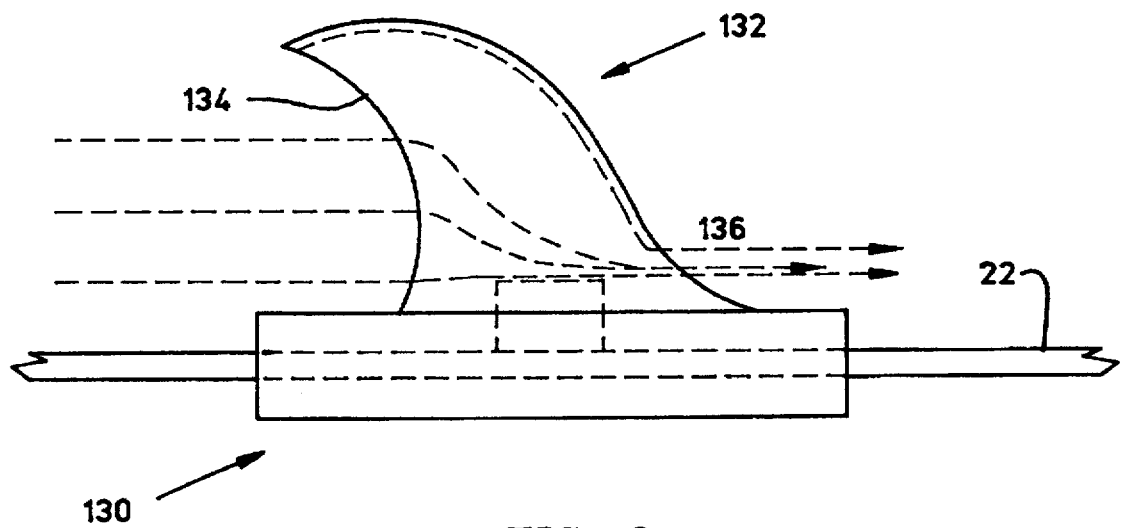
FIG. 9 shows an assembly having an air baffle for circulation of cooling air.

Yet another refinement is illustrated in FIG. 9, which shows a reinforcer assembly 130 having an air baffle 132. The air baffle includes an air inlet 134 into which an air flow can be introduced and includes an air outlet 96 from which the air flow can exit. In FIG. 9 the air flow is indicated by the dashed lines. The air flow can provide cooling air to the electrical components mounted to the cable 22. This feature can be especially advantageous in the case of active flexible circuit components.

Figure 10:
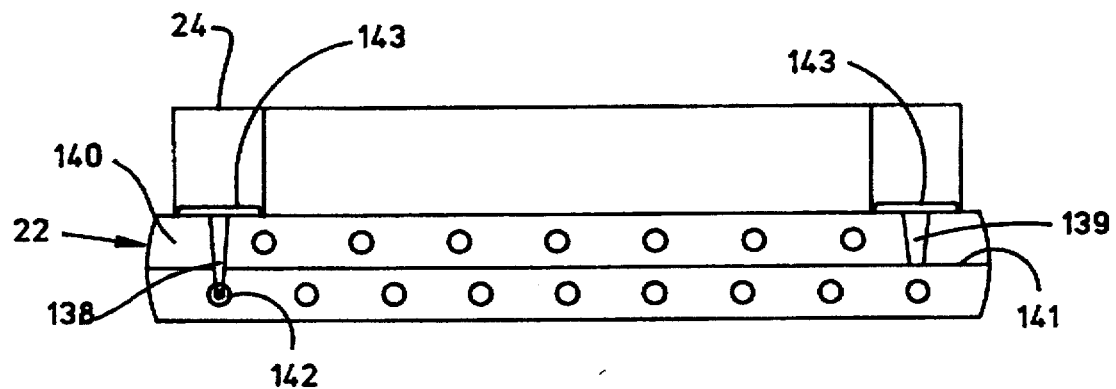
FIG. 10 is a sectional view of the assembly illustrated in FIG. 1 showing the electrical connection of the assembly with the flexible cable.

In addition to providing a stress-free enclosed area on a cable for more effective and reliable flexible circuits, the reinforcer assembly constructed in accordance with the present invention can provide improved cable performance. FIG. 10 illustrates the reinforcer assembly 24 shown in FIG. 1 in side section to show that the reinforcer assembly can comprise a flat ring, constructed from metal, that is electrically connected to one or more of the wires of the cable 22. In particular, the top reinforcer can be electrically connected to wires comprising a ground plane of the cable. The conductive reinforcer can then be electrically connected to ground. Alternatively, electrical components can be mounted onto the conductive reinforcer itself. The surface area of the reinforcer thereby provides a mounting surface for active and passive electrical components.

FIG. 10 shows that the reinforcer 24 includes a connecting prong 138 that pierces the electrical cable outer insulation layer 140 and is sized to make electrical contact with a selected one of the cable wires 142. The flexible cable 22 illustrated in FIG. 10 comprises a multiple layer flat ribbon cable, which will be readily known to those skilled in the art. Those skilled in the art will appreciate that the cable 22 can be a single-layer cable comprising one layer of wires arranged side-by-side, or can include a plurality of layers, each layer comprising wires arranged side-by-side. It should be understood that the prong 138 can be located at any desired point of the reinforcer such that the prong pierces any particular desired wire in the cable 22. The prong can be insulated along its depth, except for an exposed end, such that the prong can extend through several layers of wires.

Connections other than to a selected cable wire can be made. For example, the prong 139 can be sized so that it extends to a copper layer 141 in the cable 22 that comprises a ground plane. If the reinforcer 24 is then connected directly to device ground, a superior ground plane can be provided in that signal noise in the cable will be reduced. The selection of prong location depends on the known signals carried by the respective wires of the cable and the signal (or ground) with which connection is desired.

Figure 11:
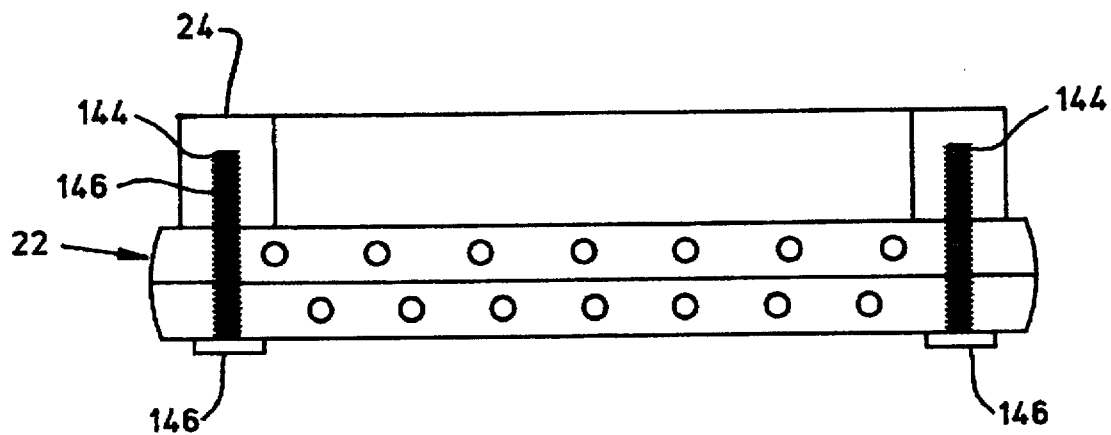
FIG. 11 is a sectional view of the assembly illustrated in FIG. 1 showing a mechanical attachment to the flexible cable.

In FIG. 10, the reinforcer 24 is mounted to the cable 22 with an adhesive material 143, such as an epoxy. Such a configuration permits rapid mounting of the reinforcer to the cable without using special tools. FIG. 11 shows that the reinforcer 24 can be mounted to the cable 22 using a mechanical scheme in which a bore 144 of the reinforcer receives a screw 146 that clamps the cable to the reinforcer. Generally, care must be taken with the FIG. 11 embodiment so that the screws 146 do not pierce the signal-carrying wires of the cable. Thus, the screws should be located such that they pass between the wires of the cable.

Figure 12:
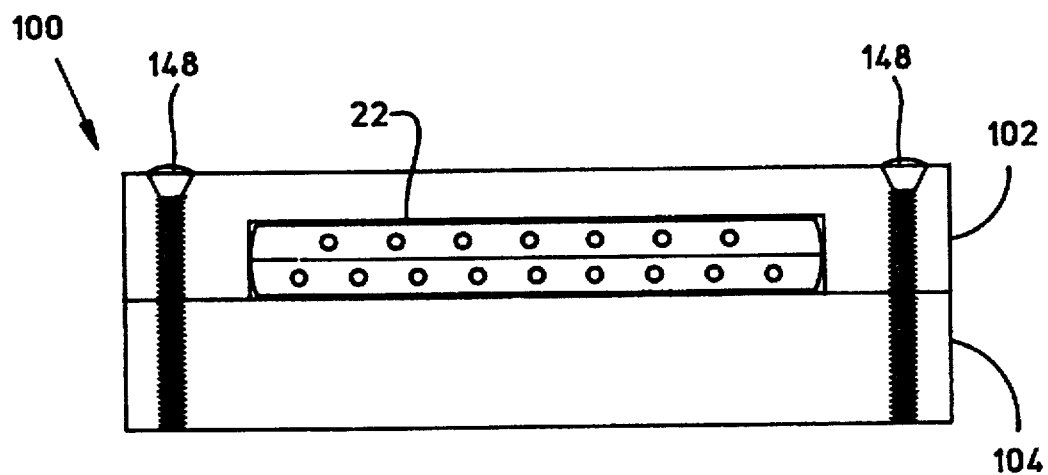
FIG. 12 is a sectional view of the assembly illustrated in FIG. 6.

FIG. 12 is a side sectional view of the reinforcement assembly 100 illustrated in FIG. 4 to show that the top plate 102 and bottom stiffener 104 can be clamped around the cable 22 with fastening screws 108 such that the cable need not be pierced by the fastening screws. That is, the sides of the top plate 102 and the bottom stiffener 104 extend beyond the width of the cable and the fastening screws pass through the respective reinforcement assembly parts 102, 104 only in an area beyond the cable width. Such an arrangement preserves the integrity of the cable insulation. The insulation integrity can be especially important if the reinforcement assembly is used in severe environmental conditions.

Figure 13:
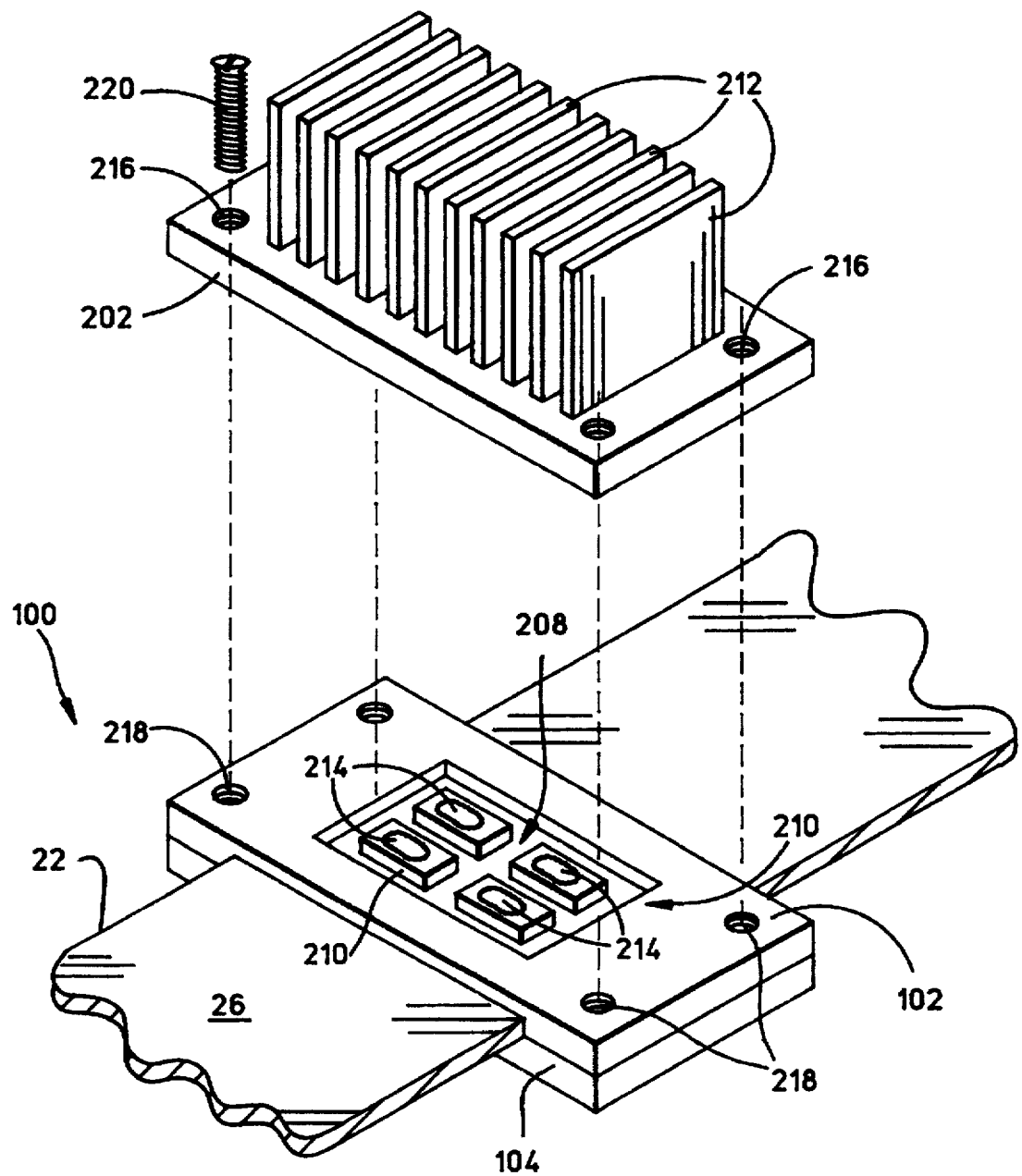
FIG. 13 is a perspective view of an assembly showing a component heat sink.

The two-piece construction of the reinforcer illustrated in FIGS. 4 and 10 permits further enhancement, such as additional structural elements. FIG. 13 shows the reinforcer 200 having the two-piece construction with a heat sink structure 202 mounted to the top plate 102, which is attached to the flexible cable 22 with the bottom stiffener 104. As with the FIGS. 6 and 12 embodiments, the top plate encloses an area 208 of the cable 22 that is stress-free and within which are mounted circuit components 210. In the FIG. 13 embodiment, the mounted circuit components include passive components and active components that generate heat. The heat sink structure 202 includes cooling fins 212 that permit heat energy to flow from the components 210 to the top plate 102 and to the cooling fins, where the heat is radiated to the ambient air. A thermal grease 214 deposited on the components enhances the heat flow and improves cooling.

Those skilled in the art will appreciate that a wide variety of useful elements can be mounted to the top plate of the reinforcer. For example, support handles, power supplies, circuit monitoring components, safety equipment, and the like can be mounted on the reinforcer for convenience. Such elements can be mounted to the top plate, to the bottom stiffener, or to both. The heat sink structure 202 includes bores 216 that align with clamping bores 218 of the top plate 102 and bottom stiffener 104 and receive screws 220 (only one of which is illustrated, for simplicity). The screws can advantageously clamp together the top plate, bottom stiffener, and heat sink.

The cable assemblies described above protect an enclosed area for stress-free mounting of flexible circuit components. The flat rings of the assemblies can be provided in a wide variety of configurations in conjunction with one or more of the features described in the drawings. Each of the flat rings provides a stress-free enclosed area of the flexible circuit cable that is suitable for mounting of the flexible circuit components with reduced susceptibility to damage.

The cable assemblies described above protect an enclosed area for stress-free mounting of flexible circuit components. The flat rings of the assemblies can be provided in a wide variety of configurations in conjunction with one or more of the features described in the drawings. Each of the flat rings provides a stress-free enclosed area of the flexible circuit cable that is suitable for mounting of the flexible circuit components with reduced susceptibility to damage.

The present invention has been described above in terms of presently preferred embodiments so that an understanding of the present invention can be conveyed. There are, however, many other configurations for producing flexible circuit assemblies not specifically described herein but with which the present invention is applicable. The present invention should therefore not be seen as limited to the particular embodiments described herein, but rather, it should be understood that the present invention has wide applicability with respect to flexible circuit technology. All modifications, variations, or equivalent arrangements that are within the scope of the attached claims should therefore be considered to be within the scope of the invention.

We claim:

1. An assembly comprising:
   a multi-conductor flexible cable having a plurality of conductors and an insulation layer; and
   a reinforcer mounted on a surface of the flexible cable, the reinforcer having a length and width such that at least one dimension is less than the corresponding dimension of the flexible cable and wherein the length and width of the reinforcer define a cable enclosure area of increased local rigidity within the reinforcer that prevents flexure of the cable and is sufficiently large to permit one or more electrical components to be connected with at least one of the conductors at a location within the enclosure area.

2. An assembly as defined in claim 1, wherein the reinforcer has a height approximately equal to the height of the electrical components.

3. An assembly as defined in claim 1, wherein a surface of the reinforcer adjacent the flexible cable includes a bore that receives a mounting device through the flexible cable.

4. An assembly as defined in claim 3, wherein the bore is threaded and the mounting device comprises a screw.

5. An assembly as defined in claim 3, further including an opposing stiffening member for mounting to the cable opposite the reinforcer.

6. An assembly as defined in claim 5, wherein the opposing stiffening member receives the mounting device and is thereby attached to the reinforcer.

7. An assembly as defined in claim 6, wherein the mounting device comprises a screw.

8. An assembly as defined in claim 1, wherein the electrical components are connected to the electrical wires on the same side of the cable on which the reinforcer is mounted.

9. An assembly as defined in claim 1, wherein the electrical components are connected to the electrical wires on the opposite side of the cable on which the reinforcer is mounted.

10. An assembly as defined in claim 1, wherein the flexible cable comprises a flat ribbon cable having multiple insulated wires.

11. An assembly as defined in claim 1, wherein the flexible cable comprises a flex cable having separate layers of conductors and insulators.

12. An assembly as defined in claim 11, wherein the flex cable includes at least one conductive layer and one insulating layer.

13. An assembly as defined in claim 1, wherein the reinforcer includes a heat sink structure.

14. An assembly as defined in claim 1, further including active electrical components mounted in the enclosure area.

15. An assembly as defined in claim 1, further including passive electrical components mounted in the enclosure area.

16. An assembly as defined in claim 1, wherein the reinforcer comprises an electrical connector in which the cable terminates.

17. An assembly as defined in claim 1, wherein the reinforcer further includes a support hook.

18. An assembly as defined in claim 1, wherein the reinforcer further includes an air baffle that directs a flow of air onto the electrical components.

19. An assembly as defined in claim 18, wherein the air baffle includes an inlet that permits a flow of air to enter the baffle and an outlet that permits the flow of air to exit the air baffle after flowing over the electrical components.

20. An assembly as defined in claim 1, wherein the reinforcer includes an electrical prong that is electrically connected to a predetermined one of the conductors.

21. An assembly as defined in claim 20, wherein one of the electrical components comprises a termination resistor.

22. An assembly as defined in claim 1, further including a sealant material deposited within the reinforcer and surrounding the electrical components.

23. An electrical cable connector comprising:
   a connector that attaches to a multi-conductor flexible cable having a plurality of conductors;

a reinforcer attached to the connector along a first edge and having a substantially flat surface that is mounted on a surface of the flexible cable, the reinforcer having a length and width such that at least one dimension is less than the corresponding dimension of the flexible cable and wherein the length and width of the reinforcer define an enclosure area encompassed within the reinforcer that prevents flexure of the cable and is sufficiently large to permit one or more electrical components to be connected with at least one of the conductors at a location within the enclosure area.

24. An electrical cable connector as defined in claim 23, wherein the reinforcer has a height approximately equal to the height of the electrical components.

25. An electrical cable connector as defined in claim 23, wherein the reinforcer further includes a support hook.

26. An electrical cable connector as defined in claim 23, wherein the reinforcer further includes an air baffle that directs a flow of air onto the electrical components.

27. An electrical cable connector as defined in claim 26, wherein the air baffle includes an inlet that permits a flow of air to enter the baffle and an outlet that permits the flow of air to exit the air baffle after flowing over the electrical components.

28. An electrical cable connector as defined in claim 23, wherein the reinforcer further includes a heat sink structure.

29. An assembly comprising:

a multi-conductor flexible cable having at least one conductor and one insulation layer; and a reinforcer having a length and width wherein at least one dimension is less than the corresponding dimension of the flexible cable and the reinforcer is attached to an outer surface of the cable such that the length and width of the reinforcer attachment defines a cable enclosure area of increased local rigidity that is shielded from bending moments that otherwise would travel along the cable and that is sufficiently large to permit one or more electrical components to be connected with at least one of the conductors at a location within the enclosure area.

* * * * *